(12) United States Patent
Augustino et al.

(10) Patent No.: US 9,093,483 B2
(45) Date of Patent: Jul. 28, 2015

(54) SHOWERHEAD ELECTRODE ASSEMBLY WITH GAS FLOW MODIFICATION FOR EXTENDED ELECTRODE LIFE

(71) Applicant: Lam Research Corporation, Fremont, CA (US)

(72) Inventors: Jason Augustino, Fremont, CA (US); Anthony de la Llera, Fremont, CA (US); Allan K. Ronne, Santa Clara, CA (US); Jaehyun Kim, Fremont, CA (US); Rajinder Dhindsa, San Jose, CA (US); Yen-Kun Wang, Union City, CA (US); Saurabh J. Ullal, South San Francisco, CA (US); Anthony J. Norell, Newark, CA (US); Keith Comendant, Fremont, CA (US); William M. Denty, Jr., San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/198,211

(22) Filed: Mar. 5, 2014

(65) Prior Publication Data

US 2014/0187049 A1 Jul. 3, 2014

Related U.S. Application Data

(62) Division of application No. 11/640,193, filed on Dec. 18, 2006, now Pat. No. 8,702,866.

(51) Int. Cl.
  *H01L 21/302* (2006.01)
  *H01L 21/461* (2006.01)
  *B44C 1/22* (2006.01)
  (Continued)

(52) U.S. Cl.
  CPC .... *H01L 21/67069* (2013.01); *C23C 16/45565* (2013.01); *C23C 16/45582* (2013.01); *H01J 37/3244* (2013.01); *H01J 37/32449* (2013.01);
  (Continued)

(58) Field of Classification Search
None
See application file for complete search history.

(56) References Cited

U.S. PATENT DOCUMENTS

| 5,728,223 A | 3/1998 | Murakami et al. |
| 6,073,577 A | 6/2000 | Lilleland et al. |

(Continued)

FOREIGN PATENT DOCUMENTS

| CN | 1582488 A | 2/2005 |
| JP | 2002-075692 A | 3/2002 |

(Continued)

OTHER PUBLICATIONS

International Search Report and Written Opinion dated May 19, 2008 for PCT/US2007/025730.

(Continued)

*Primary Examiner* — Stephanie Duclair
(74) *Attorney, Agent, or Firm* — Buchanan Ingersoll & Rooney PC

(57) ABSTRACT

A showerhead electrode assembly for a plasma processing apparatus is provided. The showerhead electrode assembly includes a first member attached to a second member. The first and second members have first and second gas passages in fluid communication. When a process gas is flowed through the gas passages, a total pressure drop is generated across the first and second gas passages. A fraction of the total pressure drop across the second gas passages is greater than a fraction of the total pressure drop across the first gas passages.

17 Claims, 8 Drawing Sheets

(51) Int. Cl.
*C03C 15/00* (2006.01)
*C03C 25/68* (2006.01)
*C23F 1/00* (2006.01)
*H01L 21/67* (2006.01)
*C23C 16/455* (2006.01)
*H01J 37/32* (2006.01)

(52) U.S. Cl.
CPC ..... *H01J 37/32541* (2013.01); *H01L 21/67017* (2013.01)

(56) References Cited

U.S. PATENT DOCUMENTS

| | | |
|---|---|---|
| 6,502,530 B1 | 1/2003 | Turlot et al. |
| 6,565,661 B1 | 5/2003 | Nguyen |
| 6,626,998 B1 | 9/2003 | Dunham |
| 6,786,175 B2 | 9/2004 | Dhindsa et al. |
| 6,793,733 B2 | 9/2004 | Janakiraman et al. |
| 6,818,096 B2 | 11/2004 | Barnes et al. |
| 6,942,753 B2 | 9/2005 | Choi et al. |
| 7,270,713 B2 | 9/2007 | Blonigan et al. |
| 7,481,886 B2 | 1/2009 | Kato et al. |
| 7,494,560 B2 | 2/2009 | Newton et al. |
| 7,543,547 B1 | 6/2009 | Kennedy et al. |
| 7,645,341 B2 | 1/2010 | Kennedy et al. |
| 8,080,107 B2 | 12/2011 | Kennedy et al. |
| 2002/0111122 A1 | 8/2002 | Korovin et al. |
| 2002/0123230 A1 | 9/2002 | Hubacek |
| 2002/0150519 A1 | 10/2002 | Barnes et al. |
| 2003/0170388 A1 | 9/2003 | Shinriki et al. |
| 2003/0209323 A1 | 11/2003 | Yokogaki |
| 2004/0129211 A1 | 7/2004 | Blonigan et al. |
| 2004/0206305 A1 | 10/2004 | Choi et al. |
| 2004/0261712 A1 | 12/2004 | Hayashi et al. |
| 2005/0133160 A1 | 6/2005 | Kennedy et al. |
| 2005/0150866 A1 | 7/2005 | O'Donnell et al. |
| 2005/0178748 A1 | 8/2005 | Buchberger et al. |
| 2006/0138081 A1 | 6/2006 | Huang et al. |
| 2006/0157448 A1 | 7/2006 | Magni et al. |
| 2006/0180275 A1 | 8/2006 | Steger |
| 2007/0068629 A1 | 3/2007 | Shih et al. |
| 2007/0235660 A1 | 10/2007 | Hudson et al. |
| 2008/0087641 A1 | 4/2008 | De La Llera et al. |
| 2008/0090417 A1 | 4/2008 | De La Llera et al. |
| 2008/0099147 A1 | 5/2008 | Myo et al. |
| 2008/0141941 A1 | 6/2008 | Augustino et al. |
| 2008/0308228 A1 | 12/2008 | Stevenson et al. |
| 2009/0081878 A1 | 3/2009 | Dhindsa |
| 2009/0111276 A1 | 4/2009 | Dhindsa et al. |
| 2009/0127234 A1 | 5/2009 | Larson et al. |
| 2009/0163034 A1 | 6/2009 | Larson et al. |
| 2009/0211085 A1 | 8/2009 | Kennedy et al. |
| 2010/0065214 A1 | 3/2010 | Kennedy et al. |

FOREIGN PATENT DOCUMENTS

| | | |
|---|---|---|
| JP | 2002-294453 A | 10/2002 |
| JP | 2003257937 | 9/2003 |
| JP | 2003-324072 A | 11/2003 |
| KR | 10-2003-0001624 A | 1/2003 |
| KR | 10-2005-0009808 A | 1/2005 |
| TW | 544721 B | 8/2003 |
| TW | 200524038 A | 7/2005 |

OTHER PUBLICATIONS

Chinese Official Action dated May 10, 2010 for Chinese Patent Application No. 200780046900.8.
Official Action mailed Jan. 20, 2012 for Japanese Patent Application No. 2009-541418.
Office Action mailed Feb. 17, 2014 for Taiwanese Patent Application No. 96148431.

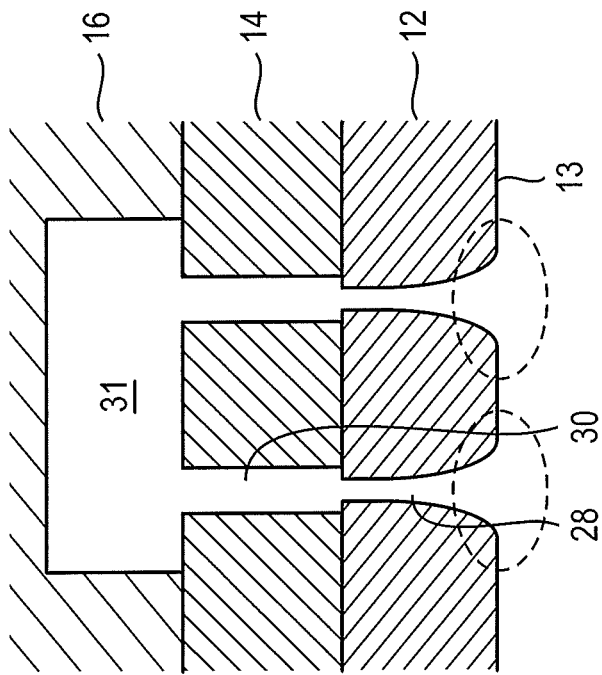
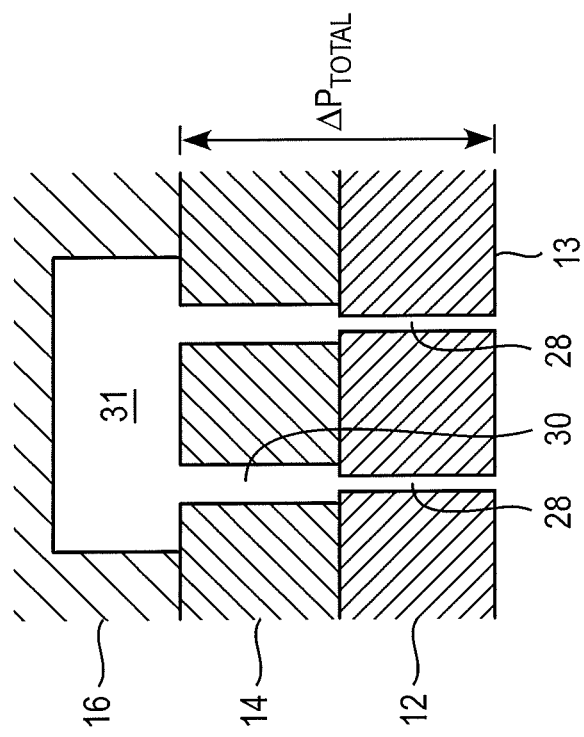

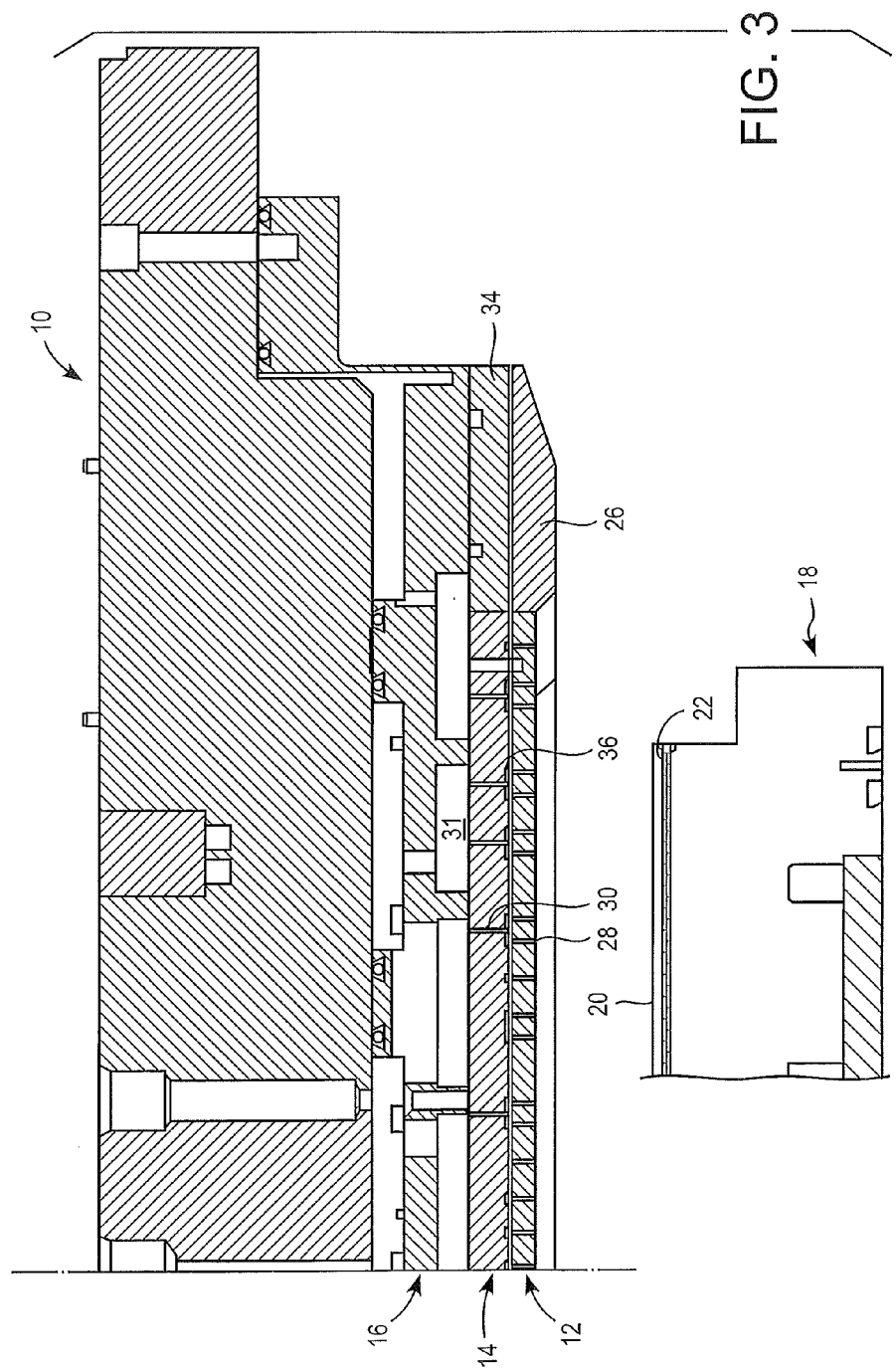

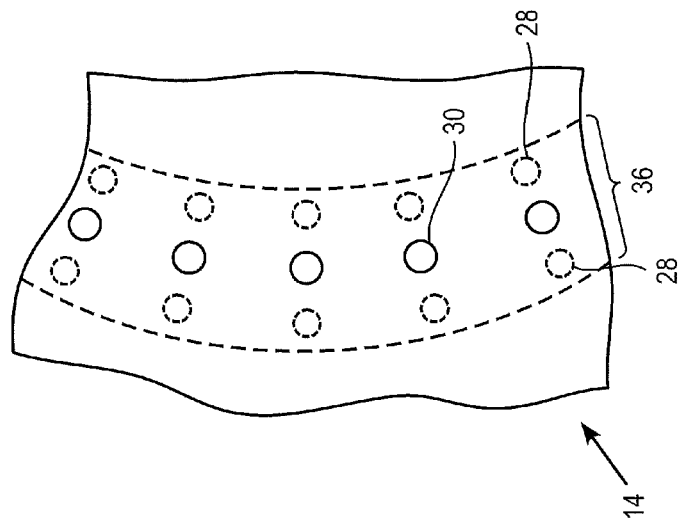
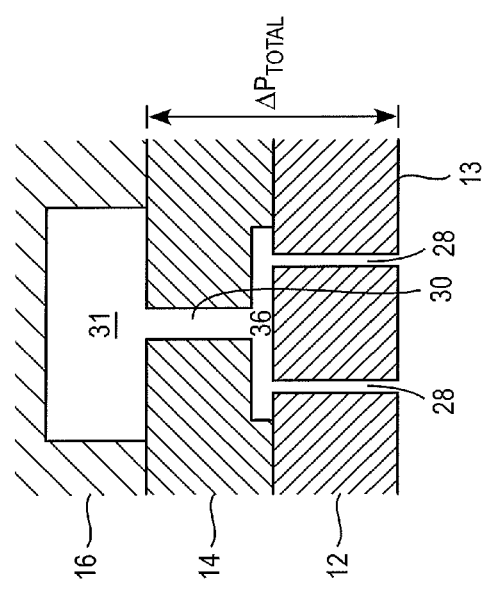
FIG. 4A
FIG. 4B

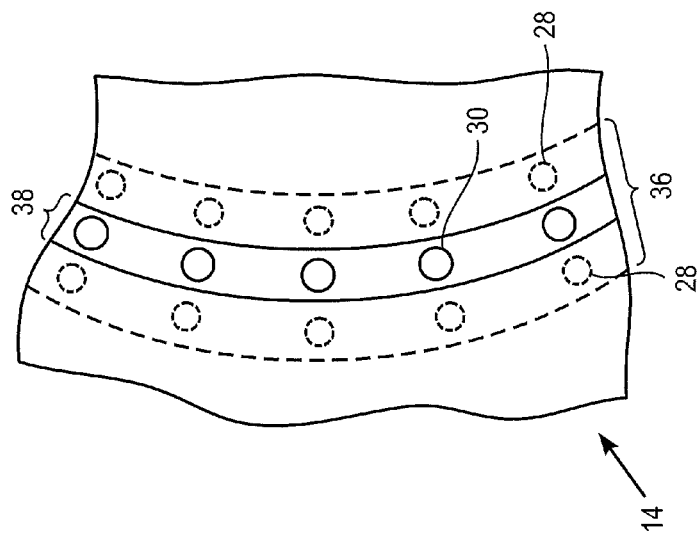
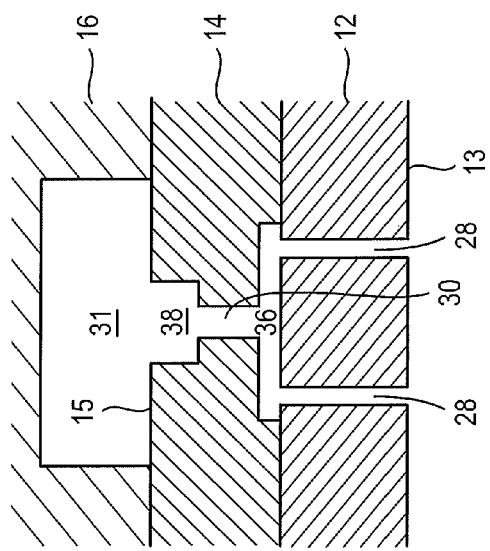

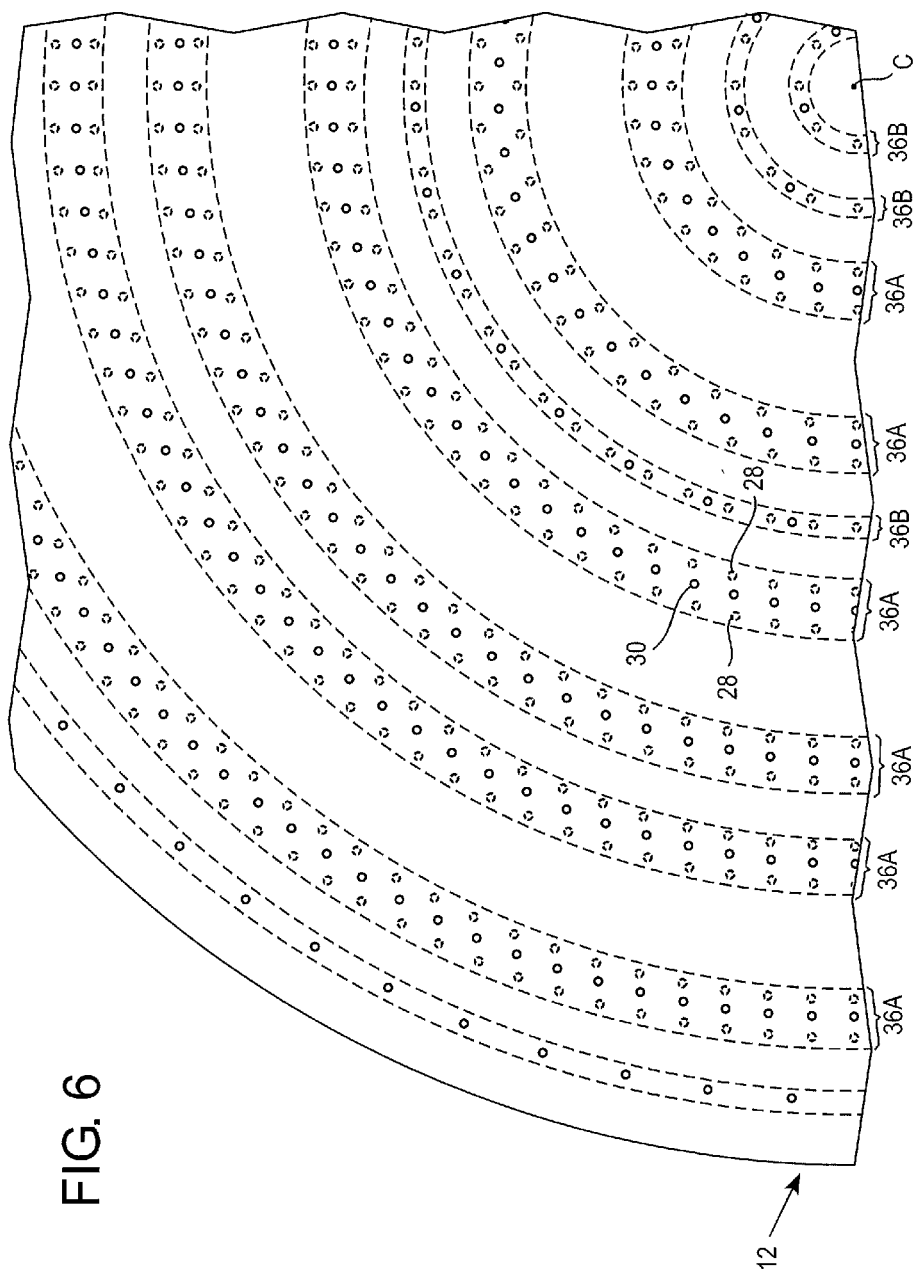

US 9,093,483 B2

SHOWERHEAD ELECTRODE ASSEMBLY WITH GAS FLOW MODIFICATION FOR EXTENDED ELECTRODE LIFE

This application is a divisional of U.S. patent application Ser. No. 11/640,193, entitled SHOWERHEAD ELECTRODE ASSEMBLY WITH GAS FLOW MODIFICATION FOR EXTENDED ELECTRODE LIFE, filed on Dec. 18, 2006, the entire content of which is hereby incorporated by reference.

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes a reaction chamber containing upper and lower electrodes. An electric field is established between the electrodes to excite a process gas into the plasma state to process substrates in the reaction chamber.

SUMMARY

Showerhead electrode assemblies for a plasma processing apparatus are provided. In an exemplary embodiment, the showerhead electrode assembly comprises an electrode having a plurality of first gas passages and a plasma-exposed surface. A backing member is attached to the electrode and has a plurality of second gas passages in fluid communication with the first gas passages. One or more first plenums are formed in the backing member and in fluid communication with the second gas passages. When a process gas is flowed through the first and second gas passages, a total pressure drop is generated across the first and second gas passages. A fraction of the total pressure drop across the second gas passages is greater than a fraction of the total pressure drop across the first gas passages.

Another exemplary embodiment of the showerhead electrode assemblies for a plasma processing apparatus includes a silicon electrode with a plasma-exposed surface and a plurality of axially extending first gas passages. A metallic backing member is attached to the electrode and has a plurality of axially extending second gas passages in fluid communication with the first gas passages. One or more first plenums are formed in the metallic backing member and in fluid communication with the second gas passages. When a process gas is flowed through the first and second gas passages, a total pressure drop is generated across the first and second gas passages. A fraction of the total pressure drop across the second gas passages is greater than a fraction of the total pressure drop across the first gas passages.

Another exemplary embodiment of the showerhead electrode assemblies for a plasma processing apparatus, includes a first member having a plurality of first gas passages having a first portion and second portion wider than the first portion. The first member has a plasma-exposed surface and the second portion is adjacent to the plasma-exposed surface. A second member is attached to the first surface of the first member, the second member having a plurality of second gas passages in fluid communication with the first gas passages. When a process gas is flowed through the first and second gas passages, a total pressure drop is generated across the first and second portions. A fraction of the total pressure drop across the second portion is greater than a fraction of the total pressure drop across the first portion.

BRIEF DESCRIPTION OF THE FIGURES

FIG. 2A is an enlarged view of a portion of the showerhead assembly shown in FIG. 1, depicting the thermal control plate and gas passages in the backing member and upper electrode.

FIG. 2B shows the upper electrode structure of FIG. 2A with eroded gas passages resulting from plasma exposure.

FIG. 3 illustrates a portion of an additional embodiment of a showerhead electrode assembly and a substrate support for a plasma processing apparatus.

FIG. 4A is an enlarged view of a portion of the showerhead electrode assembly shown in FIG. 3, depicting the thermal control plate and gas passages in the backing member and upper electrode and a plenum between the backing member and upper electrode.

FIG. 4B is a plan view of the portion of the showerhead electrode assembly shown of FIG. 4A, depicting gas passages in backing member and upper electrode and a plenum between the backing member and upper electrode.

FIG. 5A illustrates an additional embodiment of the showerhead electrode assembly, including a thermal control plate and gas passages in the backing member and upper electrode and plenums between the backing member and upper electrode and between the thermal control plate and backing member.

FIG. 5B is a plan view of the showerhead electrode assembly of FIG. 5A, depicting gas passages in the backing member and upper electrode and plenums between the backing member and upper electrode and between the thermal control plate and backing member.

FIG. 6 is a top view of the embodiment of the showerhead electrode assembly shown in FIG. 4A, illustrating the arrangement of gas passages and plenums in the backing member (broken lines) in relation to gas passages in the upper electrode (solid lines).

DETAILED DESCRIPTION

During the operation of a plasma etching or deposition system, a constant mass flow rate of reactants (i.e., process gas) is typically delivered into the processing chamber to achieve a desirable etching or deposition rate on the wafer surface (e.g., microns/minute of a thin film etched or deposited on the wafer surface). Localized variations in the gas throughput from the gas distribution system into the processing chamber can result in non-uniform etching across the surface of the wafer. Accordingly, a gas distribution system that can introduce a substantially constant gas throughput into the processing chamber during plasma processing can be advantageous in maintaining uniform etching or deposition.

The plasma etch conditions create significant ion bombardment of the surfaces of the processing chamber that are exposed to the plasma. This ion bombardment, combined with plasma chemistries and/or etch byproducts, can produce significant erosion, corrosion and corrosion-erosion of the plasma-exposed surfaces of the processing chamber. As a result, surface materials are removed by physical and/or chemical attack, including erosion, corrosion and/or corrosion-erosion. This attack causes problems including short part lifetimes, increased parts costs, particulate contamination, on-wafer transition metal contamination and process drift.

Parts with relatively short lifetimes are commonly referred to as "consumables," for example, silicon electrodes. If the consumable part's lifetime is short, then the cost of ownership is high. Erosion of consumables and other parts generates particulate contamination in plasma processing chambers. Silicon electrode assemblies used in dielectric etch tools deteriorate after a large number of RF hours (time in hours during which radio frequency power is used to generate the plasma) are run using the electrode assemblies. Such used silicon electrode assemblies exhibit etch rate drop and etch uniformity drift after a large number of RF hours are run using the electrode assemblies.

When a silicon electrode assembly, such as a showerhead electrode, is exposed to a plasma environment, erosion, corrosion and/or corrosion-erosion of the gas distribution passages occurs. Erosion typically occurs at the edges of the gas distribution passages, resulting in a widening of the passages. As a result, the overall process gas throughput for every one of the gas distribution passages increases. Additionally, this widening of the passages can also cause a drift in the mixing ratios and/or velocity of the process gases. Because etching or deposition rates of films ideally requires a specific mass of reactants from the process gas, variation in process gas throughput (i.e., volumetric gas flow rate), can locally alter the etching or deposition rates of films. As a result, erosion of the gas distribution passages can result in non-uniform etching across the wafer.

Figure 1:
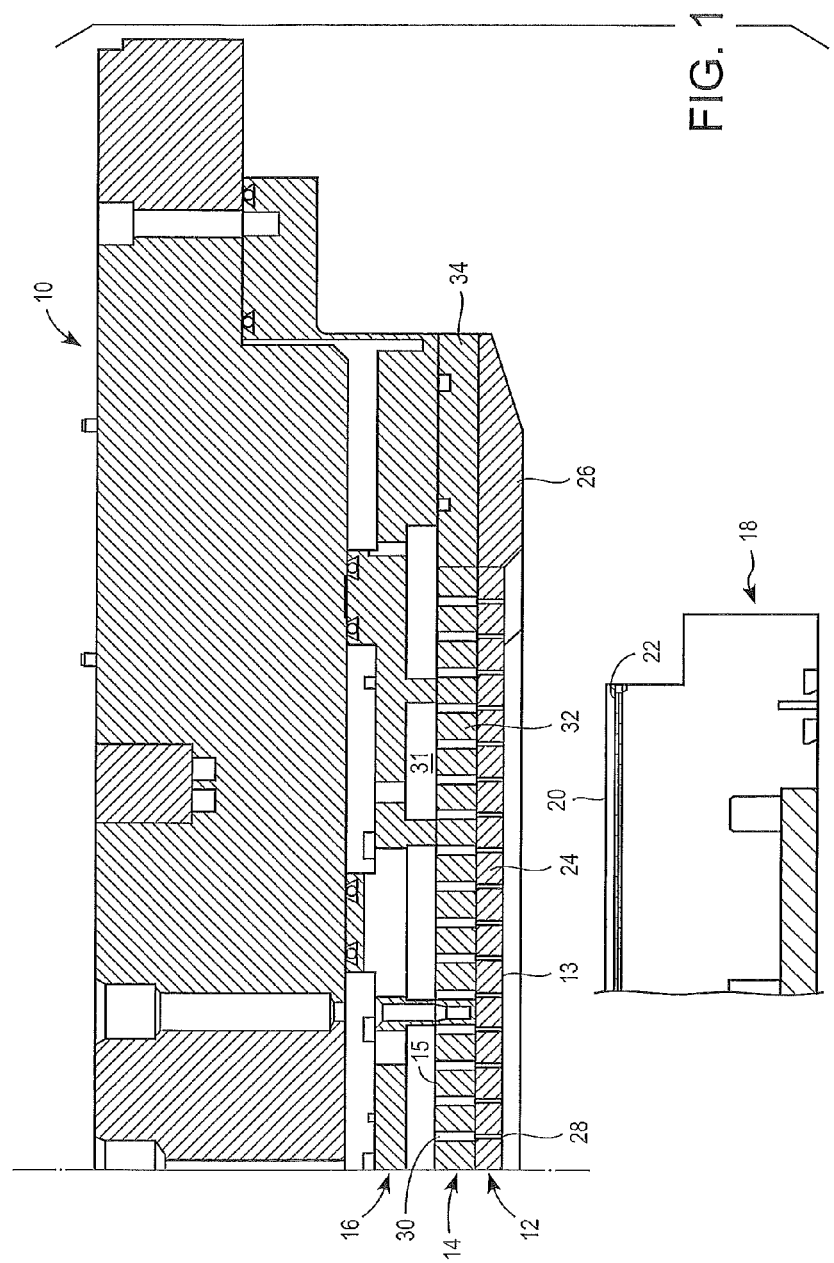
FIG. 1 illustrates a cross-sectional view of a portion of an embodiment of a showerhead electrode assembly and a substrate support for a plasma processing apparatus.

FIG. 1 illustrates an embodiment of a showerhead electrode assembly 10 for a plasma processing apparatus in which semiconductor substrates, e.g., silicon wafers, are processed. The showerhead electrode assembly is described, for example, in commonly-owned U.S. Patent Application Publication No. 2005/0133160, which is incorporated herein by reference in its entirety. The showerhead electrode assembly 10 comprises a showerhead electrode including an upper electrode 12, a backing member 14 secured to the upper electrode 12, having a plasma-exposed bottom surface 13 and a thermal control plate 16 provided on the backing member 14. A substrate support 18 (only a portion of which is shown in FIG. 1) including a bottom electrode and optional electrostatic clamping electrode is positioned beneath the upper electrode 12 in the plasma processing chamber of the plasma processing apparatus. A substrate 20 subjected to plasma processing is mechanically or electrostatically clamped on an upper support surface 22 of the substrate support 18.

The upper electrode 12 can be electrically grounded, or alternatively can be powered, such as by a radio-frequency (RF) current source. In an embodiment, the upper electrode 12 is grounded, and power at one, two or more frequencies is applied to the bottom electrode to generate plasma in the plasma processing chamber. For example, the bottom electrode can be powered at frequencies of 2 MHz and 27 MHz by two independently-controlled radio-frequency power sources. After substrate 20 has been processed, the supply of power to the bottom electrode is shut off to terminate plasma generation.

In the embodiment shown in FIG. 1, the upper electrode 12 of the showerhead electrode includes an inner electrode member 24, and an optional outer electrode member 26. The inner electrode member 24 is typically a cylindrical plate (e.g., a plate composed of single crystal silicon or silicon carbide). The inner electrode member 24 can have a diameter smaller than, equal to, or larger than a wafer to be processed, e.g., a diameter up to 12 inches (300 mm) if the plate is made of single crystal silicon. In a preferred embodiment, the showerhead electrode assembly 10 is large enough for processing large substrates, such as semiconductor wafers having a diameter of 300 mm or larger. For 300 mm wafers, the upper electrode 12 is up to 300 mm in diameter. However, the showerhead electrode assembly 10 can be sized to process other wafer sizes or substrates having a non-circular configuration.

In the illustrated embodiment, the inner electrode member 24 is wider than the substrate 20. For processing 300 mm wafers, the outer electrode member 26 is provided to expand the diameter of the upper electrode 12 from, for example, about 15 inches to about 17 inches. The outer electrode member 26 can be a continuous member (e.g., a continuous polysilicon ring), or a segmented member (e.g., including 2-6 separate segments arranged in a ring configuration, such as multiple segments composed of single crystal silicon). In embodiments of the upper electrode 12 that include a multiple-segment, outer electrode member 26, the segments preferably have edges, which overlap each other to protect an underlying bonding material from exposure to plasma. The inner electrode member 24 preferably includes multiple gas passages 28 extending through and in correspondence with multiple gas passages 30 formed in the backing member 14 for injecting process gas into a space in a plasma processing chamber located between the upper electrode 12 and the substrate support 18. The thermal control plate 16 includes multiple plenums 31 to distribute process gases to the gas passages 28 and 30 in the inner electrode member 24 and backing member 14, respectively.

Single crystal silicon is a preferred material for the inner electrode member 24 and the outer electrode member 26. High-purity, single crystal silicon minimizes contamination of substrates during plasma processing, and also wears smoothly during plasma processing, thereby minimizing particles. Alternative materials that can be used for plasma-exposed surface 13 of the upper electrode 12 including inner electrode member 24 and the outer electrode member 26 are SiC or AlN, for example.

In the embodiment shown in the FIG. 1, the backing member 14 includes a backing plate 32 and a backing ring 34 extending around the periphery of backing plate 32. In the embodiment, the inner electrode member 24 is co-extensive with the backing plate 32, and the outer electrode member 26 is co-extensive with the surrounding backing ring 34. However, in another embodiment, the backing plate 32 can extend beyond the inner electrode member 24 such that a single-piece backing member can be used to support the inner electrode member 24 and the outer electrode member 26. The inner electrode member 24 and the outer electrode member 26 are preferably attached to the backing member 14 by a bonding material.

The backing plate 32 and backing ring 34 are preferably made of a material that is chemically compatible with process gases used for processing semiconductor substrates in the plasma processing chamber, and is electrically and thermally conductive. Exemplary suitable materials that can be used to make the backing member 14 include graphite, aluminum, aluminum alloys, and SiC.

The upper electrode 12 can be attached to the backing plate 32 and the optional backing ring 34 with a suitable material, such as a thermally and electrically conductive elastomeric bonding material that accommodates thermal stresses, and transfers heat and electrical energy between the upper electrode 12 and the backing plate 32 and backing ring 34. The use of elastomers for bonding together surfaces of an electrode assembly is described, for example, in commonly-owned U.S. Pat. No. 6,073,577, which is incorporated herein by reference in its entirety.

For showerhead electrode assembly 10, process gas flows from the plenums 31 formed in the thermal control plate 16 through gas passages 28 and 30 in the upper electrode 12 and backing member 14, respectively, before being injected into the space in a plasma processing chamber located between the upper electrode 12 and substrate support 18. The process gas enters gas passages 30 located in backing member 14 at the top surface 15 of the backing member 14 at an entrance pressure ($P_{INLET}$) and exits passages 28 located in inner electrode member 24 at the plasma-exposed surface 13 at an exit pressure ($P_{OUTLET}$). The difference between the entrance pressure and exit pressure is the total pressure drop (i.e., $\Delta P_{TOTAL} = P_{INLET} - P_{OUTLET}$) across gas passages 28 and 30.

Conductance, C, is the ability of the gas passages 28 and 30 to transmit gas therethorough. The conductance of a gas passage is determined by the size and geometry of the gas passage. For example, the conductance of a cylindrical gas passage increases with increasing diameter. Likewise, for a given gas passage diameter, the conductance of the gas passage decreases as the length of the passage increases. The total of conductance, $C_{TOTAL}$, of gas passages 28 and 30 can be approximated as the sum of the total conductance of gas passages 28 ($C_E$) in the upper electrode 12 and the total conductance of gas passages 30 ($C_B$) in the backing member 14 (i.e., $C_{TOTAL} = C_E + C_B$).

The overall gas throughput, Q, for gas passages 28 and 30 is determined by the product of the total conductance of the gas passages 28 and 30 and the total pressure drop (i.e., $Q = C_{TOTAL} \Delta P_{TOTAL} = (C_E + C_B) \Delta P_{TOTAL}$). However, because the inner electrode member 24 has a plasma-exposed surface 13, gas passages 28 are subject to erosion, altering the geometry of each gas passage 28 and raising the total conductance or $C_E$ of gas passages 28. The total pressure drop ($\Delta P_{TOTAL}$) and the conductance of gas passages 30 ($C_B$) remain substantially constant when gas passages 28 are eroded. However, any increase in conductance $C_E$ due to erosion of the gas passages 28 affects (i.e., increases) the overall gas throughput Q.

FIGS. 2A and 2B depict the occurrence of erosion of gas passages in an electrode of an upper electrode. FIG. 2A is an enlarged view of a portion of a thermal control plate 16, which includes plenum 31 in fluid communication with axial gas passages 28 and 30 shown in FIG. 1. In FIG. 2A, each gas passage 30 in the backing member 14 corresponds to a gas passage 28 in the inner electrode. In other words, there is a one-to-one correspondence between gas passages 30 and 28. As a process gas flows through gas passages 28 and 30 to supply the reaction chamber, there is a total pressure drop, across the gas passages 28, 30. For the embodiment shown in FIG. 2A, computer simulations have demonstrated that about 20% of the total pressure drop, $\Delta P_{TOTAL}$, occurs across gas passages 30, located in backing member 14; the remaining portion of the total pressure drop (about 80% of total pressure drop) occurs across in gas passages 28. Gas passages 28 are located in inner electrode member 24, which is subject to plasma erosion at plasma exposed surface 13.

As shown in FIG. 2B, the prolonged exposure of the inner electrode member 24 to a plasma environment results in the erosion of the edges of gas passage 28 (indicated by the dashed ovals) at the plasma-exposed surface 13. The erosion of an axial cylindrical gas passage 28, results in widening of the gas passage 28 in the region closest to the plasma. This change in the geometry of the gas passage 28 increases its conduction, $C_E$, and thus changes the overall gas throughput through gas passages 28. Furthermore, because a large percentage of the total pressure drop occurs across gas passages 28, any change in the conductance $C_E$ due to the erosion of gas passages 28 has a relatively greater impact on the overall gas throughput Q of gas passages 28 and 30. For example, assuming that $\Delta P_E = 0.8 \Delta P_{TOTAL}$ and $\Delta P_B = 0.2 \Delta P_{TOTAL}$, the overall gas throughput $Q = 0.80(C_E \Delta P_{TOTAL}) + 0.20(C_B \Delta P_{TOTAL})$. Accordingly, because of the greater contribution of the $C_E \Delta P_{TOTAL}$ term to the overall throughput Q, any variations in the conductance, $C_E$, of gas passage 28 due to plasma erosion have a greater impact in varying the gas throughput Q than the $C_B \Delta P_{TOTAL}$ term. As a result, the inner electrode member 24 must be periodically replaced.

It has been determined that one solution for maintaining a substantially uniform gas throughput Q through gas passages 28 and 30, even after erosion of the gas passages 28, is to modify these gas flow paths to effectively minimize the $C_E \Delta P_{TOTAL}$ contribution of the gas passages 28 to the overall throughput Q, so that the effect of the variation in $C_E$ on Q as gas passages 28 erode due to plasma exposure is reduced. In one embodiment, the gas flow performance of the electrode assembly is modified by shifting the distribution of $\Delta P_{TOTAL}$ such that a smaller percentage of the total pressure drop $\Delta P_{TOTAL}$ occurs across the eroded region of the gas passages 28. For example, gas flow paths in the backing member 14 and the upper electrode 12 can be modified such that a smaller percentage of the total pressure drop $\Delta P_{TOTAL}$ occurs across gas passages 28 located in upper electrode 12. In other words, the contribution of the $C_E \Delta P_{TOTAL}$ term to the overall throughput, Q, can be reduced by lowering the percentage of the total pressure drop $\Delta P_{TOTAL}$ across gas passages 28.

This reduction in the percentage of total pressure drop $\Delta P_{TOTAL}$ across the eroded region of the gas passages 28 can be achieved by one or more of the following structural modifications: changing the total number of gas passages 28 and 30; changing the shape and/or dimensions of the gas passages 28 and/or 30; changing the ratio of gas passages 28 in communication with respective gas passages 30; or through the addition of one or more plenums of suitable geometries between the backing member 14 and upper electrode 12. These structural features can be optimized individually, or in combination, to achieve the desired percentage of the total pressure drop $\Delta P_{TOTAL}$ across gas passages 28 during flow of gas through gas passages 28 and 30.

FIG. 3 illustrates an embodiment of a showerhead electrode assembly 10 for a plasma processing apparatus, including a modification to the features of the gas distribution passages 28 and 30. For this embodiment, each axial gas passage 30 in the backing member 14 corresponds to two gas passages 28 in the upper electrode 12 (e.g., inner electrode member 24), with each gas passage 30 in fluid communication with a respective plenum 36 formed in a surface of the backing member 14.

In alternative embodiments, each gas passage 30 in the backing member 14 can correspond to more than two gas passages 28 in the inner electrode 12, such as three or four gas passages.

FIGS. 4A and 4B illustrate a portion of the showerhead electrode assembly shown in FIG. 3, depicting the thermal control plate 16, which includes plenum 31 in fluid communication with gas passages 30 and 28, with a plenum 36 in backing member 14. In other words, there is a two-to-one correspondence between gas passages 28 and gas passage 30. The plenum 36 in backing member 14 serves to distribute gas uniformly from gas passages 30 to gas passages 28. For this embodiment, backing member 14 can be composed of aluminum and upper electrode 12 of silicon, for example.

FIG. 4B is a top view of the embodiment of a portion of the showerhead electrode assembly shown in FIG. 4A in which backing member 14 and upper electrode 12 are circular and the plenums 36 are radially-spaced annular channels formed in a surface of backing member 14 facing upper electrode 12 (thermal control plate 16 not shown for simplicity). Plenums 36 can either be continuous or segmented. For example, in the embodiment, the diameter of gas passages 28 and 30 can range from 0.001 to 0.010 inches. The depth of the plenum 36 can range from 0.01 to 0.03 inches.

For the embodiment shown in FIGS. 4A and 4B, it has been demonstrated by computer simulation that about 78% of the total pressure drop occurs across gas passages 30, located in backing member 14; the remaining portion of the total pressure drop (about 22% of the total pressure drop) occurs across gas passages 28. This is substantially opposite to the contributions of the gas passages 28 and 30 to the total pressure drop of the embodiment shown in FIG. 2A. Thus, in the embodiment shown in FIGS. 4A and 4B, because a much smaller percentage of the total pressure drop (about 22% of total pressure drop) occurs across gas passages 28, any change in the conductance $C_E$ due to the erosion of gas passage 28 has a smaller impact on overall gas throughput Q of gas passages 28 and 30 (i.e., $Q=0.22(C_E \Delta P_{TOTAL})+0.78(C_B \Delta P_{TOTAL})$). As a result, because of the reduced contribution of $C_E \Delta P_{TOTAL}$ to the overall gas throughput Q, any variations in the conductance, $C_E$, of gas passage 28 due to plasma erosion (such as shown in FIG. 2B) has a smaller impact in varying the throughput Q as compared to such erosion of the gas passage 20 of the embodiment shown in FIG. 2A. For example, the ratio of $C_B \Delta P_{TOTAL}$ to $C_E \Delta P_{TOTAL}$ can range from about 3:1 to 5:1. As a result of producing a more consistent gas throughput, the silicon upper electrode 12 shown in FIGS. 4A and 4B can potentially provide a greater lifespan, although gas passages 28 may experience erosion.

FIGS. 5A and 5B illustrate an alternative embodiment of the showerhead electrode assembly, in which an additional plenum 38 is formed in the top surface 15 of the backing member 14 between the plenum 31 and the backing member 14. The plenum 38 is aligned with one or more gas passages 30 and plenum 31 in the thermal control plate 16. As shown, plenum 38 has a smaller width than plenum 36. The dimensions of the plenum 38 can be optimized such that a smaller percentage of the total pressure drop $\Delta P_{TOTAL}$ occurs in gas passages 28. For example, plenum 38 can be an annular channel or groove.

FIG. 5B is a top view of the embodiment shown in FIG. 5A in which backing member 14 and upper electrode 12 are circular and the plenums 36, 38 are radially-spaced annular channels formed on opposite surfaces of the backing member 14, facing upper electrode 12 and facing away from upper electrode 12 (thermal control plate 16 not shown for simplicity). Plenums 36, 38 can either be continuous or segmented.

FIG. 6 is a top view of the upper electrode 12 of the embodiment in FIGS. 4A and 4B, illustrating an exemplary arrangement of gas passages 28 and annular plenums 36 in backing member 14 (not shown) in relation to gas passages 28 in the upper electrode 12. Typically, the upper electrode 12 is a circular plate and gas passages 28 and 30 extend axially through the plate at different radial distances from the center axis C of the plate. In this embodiment, plenums 36A/36B can either be continuous annular grooves, as shown in FIG. 4B or not extended continuously for 360°, such as about 60° or about 90° (not shown).

FIG. 6 also illustrates two embodiments for different positional configurations of gas passages 30 and 28. In one embodiment, corresponding to plenum 36A, gas passage 30 and two corresponding gas passages 28 have different radial distances relative to the center C of circular upper electrode 12. In another embodiment, corresponding to plenum 36B, gas passage 30 and two corresponding gas passages 28 have about the same radial distance relative to the center C of the circular upper electrode 12, but all three gas passages have different angular positions.

Figure 7:
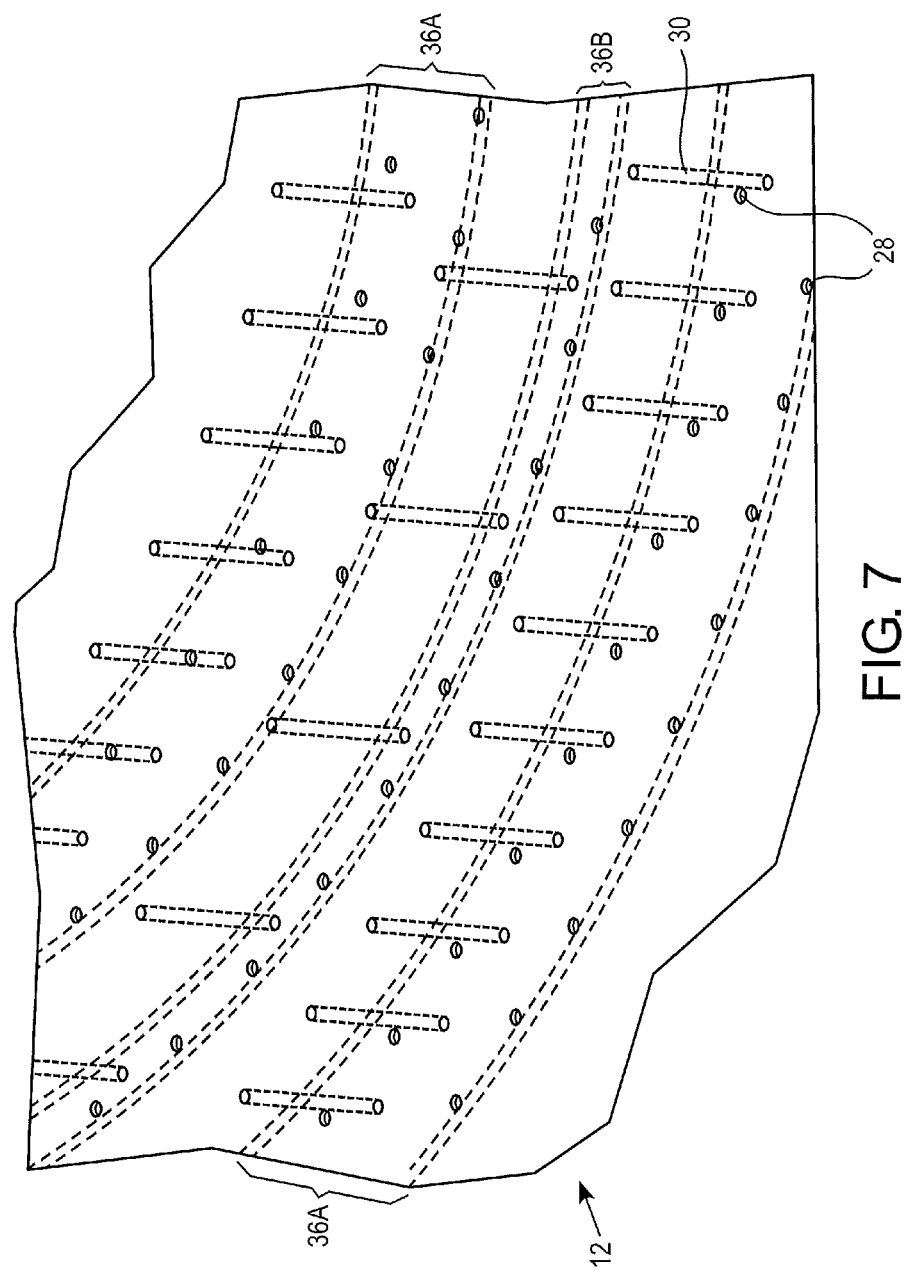
FIG. 7 is a three-dimensional perspective view of a portion of the embodiment of the showerhead electrode assembly of FIG. 6, showing the upper electrode (solid lines) and gas passages and plenums of the backing member (broken lines).

FIG. 7 is a three-dimensional perspective view of a portion of the embodiment of the showerhead electrode assembly of FIG. 6. FIG. 7 also illustrates the arrangement of gas passages 28, 30 and plenums 36A, 36B (backing member 14 not shown for simplicity).

The embodiment shown in FIG. 4, with a two-to-one correspondence between gas passages 28 and gas passage 30, requires fewer gas passages 30 to be formed. Additionally, fluid communication between the gas passages 30 and 28 can be achieved without precise alignment of the gas passages 30 and 28. Instead, gas passages 28 only need to be aligned with a corresponding annular plenum 36.

In one embodiment of the showerhead electrode assembly, backing member 14 is a metallic material, such as aluminum or an aluminum alloy. Metallic components are generally more cost effective and easier to machine, in comparison to their non-metallic counterparts such as graphite backing members. For some applications, metallic materials provide improved stability under extreme operating conditions and generate fewer particles than non-metallic materials, such a graphite. However, use of an aluminum backing member 14 may result in interactions between certain process gases and the aluminum.

For example, fluorine-containing gas (e.g., $CF_4$, $CHF_3$) plasmas can be used in plasma process chambers for etching dielectrics or organic materials. The plasma produced from these gases is composed of partially ionized fluorine gas, including ions, electrons, and other neutral species, such as radicals. However, aluminum chamber hardware, when exposed to low-pressure, high-power, fluorine-containing gas plasma, can produce aluminum fluoride (i.e., $AlF_X$) byproduct.

The embodiments of the showerhead electrode assembly shown in FIGS. 4A, 4B and 5A, 5B is adapted to reduce the exposure of the aluminum backing member 14 to such fluorine ions and/or radicals when fluorine-containing process gases are used. During plasma processing such process gases, fluorine ions or radicals may migrate through gas passages 28 and react with the aluminum backing member 14. Thus, the plenum 36 increases the diffusion length of an ion or radical (i.e., the distance from the upper end of the gas passage 28 to an aluminum surface of the backing member) as compared to the embodiment shown in FIG. 2A, reducing the probability of such ions or radicals interacting with the aluminum backing member 14. In other words, the plenum 36 reduces the line of sight from ions or radicals in the plasma to an exposed aluminum surface.

In another embodiment, aluminum fluoride formation can be minimized by coating the surface of the backing member 14 defining the plenum 36 with a coating to prevent reactions between the aluminum and fluorine. For example, the surface of the backing member 14 defining plenum 36 can be anodized, or coated with a suitable ceramic or polymer coating. Examples of ceramic coatings include oxides (e.g., silicon oxide, aluminum oxide), nitrides or carbides. Examples of polymer coatings include polytetrafluoroethylene (PTFE) or polyetheretherketone (PEEK).

Figure 8:
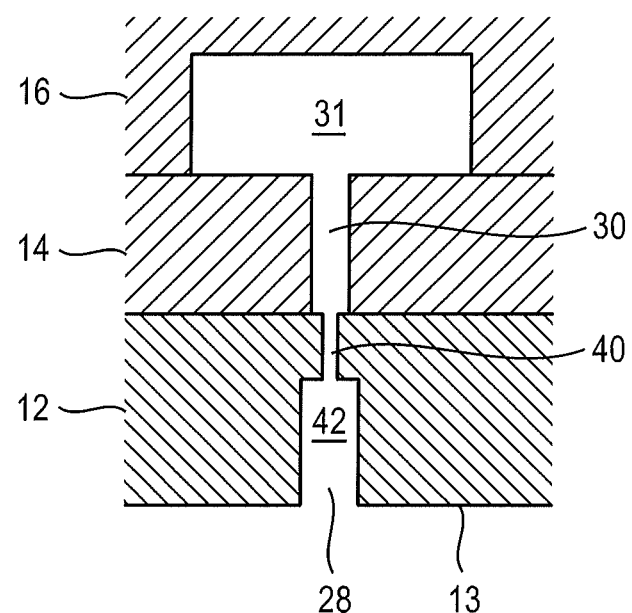
FIG. 8 shows a portion of an additional embodiment of the showerhead electrode assembly, depicting a thermal control plate and gas passages in the backing member and upper electrode, the gas passage in the upper electrode having portions with different cross-sectional areas.

FIG. 8 illustrates an additional embodiment of the showerhead electrode assembly in which the erosion of gas passages 28 has lesser impact on overall gas throughput Q of gas passages 28 and 30. As seen in FIG. 8, gas passages 28 include a first portion 40 and a second portion 42, wider than the first portion 38. The second portion 42 is adjacent to plasma-exposed surface 13. As process gas flows through gas passage 28, a greater fraction of the total pressure drop $\Delta P_{TOTAL}$ occurs across the smaller first portion 40 than the second portion 42 of gas passages 28. This reduction in the percentage of total pressure drop $\Delta P_{TOTAL}$ near the outlet end of the gas passage thus reduces the influence of erosion on the overall throughput Q flowing through gas distribution passages 28 and 30.

While the invention has been described in detail with reference to specific embodiments thereof, it will be apparent to those skilled in the art that various changes and modifications can be made, and equivalents employed, without departing from the scope of the appended claims.

What is claimed is:

1. A method of processing a semiconductor substrate in a plasma processing apparatus including a showerhead electrode assembly for a plasma processing apparatus, comprising a silicon electrode with a plasma-exposed surface, the electrode having a plurality of axially extending first gas passages; a metallic backing member attached to the electrode and having a plurality of axially extending second gas passages in fluid communication with the first gas passages; one or more first plenums formed in the metallic backing member and in fluid communication with the second gas passages; wherein when a process gas is flowed through the first and second gas passages a total pressure drop is generated across the first and second gas passages, the method comprising:

placing a substrate on a substrate support in a processing chamber of the plasma processing apparatus;
introducing the process gas into the reaction chamber with the showerhead electrode assembly so as to provide a ratio of total pressure drop across the second gas passages to total pressure drop across the first gas passages of 3:1 to 5:1;
generating a plasma from the process gas in the reaction chamber between the showerhead electrode assembly and the substrate; and
processing the substrate with the plasma.

2. The method of claim 1, wherein the process gas is a fluorine-containing gas and the metallic backing member is composed of aluminum or an aluminum alloy.

3. The method of claim 2, wherein surfaces of the metallic backing member facing the electrode defining the one or more first plenums are coated, wherein the coating is adapted to reduce aluminum fluoride formation.

4. The method of claim 3, further comprising one or more second plenums formed in a surface of the metallic backing member facing away from the silicon electrode, wherein each second plenum is in fluid communication with one or more second gas passages.

5. The method of claim 3, wherein surfaces of the backing member defining the first plenums are coated with anodized aluminum, a ceramic, or polymeric material.

6. The method of claim 1, wherein two or more of the first gas passages are in fluid communication with one second gas passage.

7. The method of claim 6, wherein the two or more first gas passages and the one second gas passage are located at different radial positions relative to a center of the respective electrode and backing member.

8. The method of claim 6, wherein the two or more first gas passages and one second gas passage are located at substantially the same radial positions and different angular positions relative to a center of the respective electrode and metallic backing member.

9. The method of claim 1, wherein the electrode is composed of silicon, graphite, or silicon carbide.

10. The method of claim 1, wherein the one or more first plenums are formed in a surface of the metallic backing member facing the electrode.

11. The method of claim 10, further comprising one or more second plenums formed in a surface of the metallic backing member facing away from the electrode.

12. The method of claim 11, wherein the first and second plenums are radially-spaced annular channels.

13. The method of claim 11, wherein the first and second plenums are continuous or segmented.

14. The method of claim 1, further comprising a thermal control plate attached to the metallic backing member.

15. The method of claim 14, wherein the first and second plenums are continuous or segmented.

16. The method of claim 15, further comprising one or more third plenums formed in the thermal control plate, wherein each third plenum is in fluid communication with one or more second gas passages.

17. The method of claim 1, comprising:
obtaining the 3:1 to 5:1 ratio of total pressure drop across the second gas passages to the total pressure drop across the first gas passages with a total number of first gas passages, which is two to four times greater than a total number of second gas passages.

* * * * *